(12) United States Patent
Oonishi et al.

(10) Patent No.: US 12,075,575 B2
(45) Date of Patent: Aug. 27, 2024

(54) IMAGE DISPLAY DEVICE

(71) Applicant: Panasonic Intellectual Property Management Co., Ltd., Osaka (JP)

(72) Inventors: Ryouji Oonishi, Osaka (JP); Shigeru Aruga, Osaka (JP); Hidekazu Nishikoori, Osaka (JP); Ichiro Okuda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 281 days.

(21) Appl. No.: 17/787,812

(22) PCT Filed: Dec. 18, 2020

(86) PCT No.: PCT/JP2020/047547
§ 371 (c)(1),
(2) Date: Jun. 21, 2022

(87) PCT Pub. No.: WO2021/132105
PCT Pub. Date: Jul. 1, 2021

(65) Prior Publication Data
US 2023/0021887 A1 Jan. 26, 2023

(30) Foreign Application Priority Data

Dec. 25, 2019 (JP) ................. 2019-233620

(51) Int. Cl.
*H05K 5/00* (2006.01)
*H05K 5/02* (2006.01)

(52) U.S. Cl.
CPC ......... *H05K 5/0069* (2013.01); *H05K 5/0018* (2022.08); *H05K 5/0247* (2013.01)

(58) Field of Classification Search
CPC ... H05K 5/0069; H05K 5/0018; H05K 5/0247
See application file for complete search history.

(56) References Cited

U.S. PATENT DOCUMENTS

2006/0066236 A1   3/2006 Tanaka et al.
2013/0194167 A1* 8/2013 Yun ................. H10K 59/50
                                                            345/84

(Continued)

FOREIGN PATENT DOCUMENTS

| JP | 2006-092908 A | 4/2006 |
|----|---------------|--------|
| JP | 2013-156635 A | 8/2013 |
| JP | 2016-136255 A | 7/2016 |

OTHER PUBLICATIONS

International Search Report issued on Mar. 9, 2021 in International Patent Application No. PCT/JP2020/047547, with English translation.

*Primary Examiner* — Gary C Hoge
(74) *Attorney, Agent, or Firm* — Rimon P.C.

(57) ABSTRACT

An image display device includes: a display panel body; first and second drive boards spaced apart from each other along one side of the display panel body; a first flexible board which electrically connects the display panel body and the first drive board and a second flexible board which electrically connects the display panel body and the second drive board; a light control panel body switchable between a transmissive state and a non-transmissive state; and a first electrode portion including a first electrode body disposed in an outer peripheral portion of the light control panel body along one side of the display panel body, and a first electrode tab which extends from the first electrode body crossing the one side of the display panel body while avoiding an overlap with the first and second drive boards in a front view of the display panel body.

5 Claims, 16 Drawing Sheets

(56) References Cited

U.S. PATENT DOCUMENTS

| | | | | |
|---|---|---|---|---|
| 2016/0225310 A1* | 8/2016 | Farell | ............... | G01D 13/28 |
| 2021/0165469 A1* | 6/2021 | Kazama | ............... | G06F 1/183 |
| 2021/0235893 A1* | 8/2021 | Yamashita | ............... | A47F 11/06 |

* cited by examiner

IMAGE DISPLAY DEVICE

CROSS-REFERENCE OF RELATED APPLICATIONS

This application is the U.S. National Phase under 35 U.S.C. § 371 of International Patent Application No. PCT/JP2020/047547, filed on Dec. 18, 2020, which in turn claims the benefit of Japanese Patent Application No. 2019-233620, filed on Dec. 25, 2019, the entire disclosures of which Applications are incorporated by reference herein.

TECHNICAL FIELD

The present disclosure relates to an image display device which is switchable between an image display mode and a transmissive mode.

BACKGROUND ART

Patent Literature (PTL) 1 discloses an image display device which is switchable between an image display mode and a transmissive mode. This type of image display device includes a display panel which displays an image, a light control panel facing the back surface of the display panel, and a controller which switches between an image display mode and a transmissive mode.

In the image display mode, the controller causes the display panel to display an image, and switches the light control panel to a non-transmissive state where light is not transmissive through the light control panel. As a result, it is possible to prevent external light from entering the back surface of the display panel, so that a clear image with a high contrast can be displayed on the display panel.

In the transmissive mode, the controller causes the display panel not to display an image, and switches the light control panel to a transmissive state where light is transmissive through the light control panel. As a result, objects placed behind the light control panel are visible through the display panel and the light control panel from the front.

CITATION LIST

Patent Literature

[PTL 1] Japanese Unexamined Patent Application Publication No. 2013-156635

SUMMARY OF INVENTION

Technical Problem

The present disclosure provides an image display device capable of preventing lead wires from interfering with flexible boards.

Solution to Problem

An image display device according to the present disclosure includes: a display panel body which displays an image on a front surface of the display panel body; a drive board which is disposed along one side of the display panel body to drive the display panel body; a flexible board which electrically connects the display panel body and the drive board; a light control panel body which faces a back surface of the display panel body, the light control panel body being switchable between a transmissive state and a non-transmissive state, the transmissive state being a state where light is transmissive through the light control panel body, the non-transmissive state being a state where less light is transmissive through the light control panel body than the transmissive state; and an electrode portion which includes an electrode body and an electrode tab, the electrode body being disposed in an outer peripheral portion of the light control panel body along the one side of the display panel body, the electrode tab extending from the electrode body crossing the one side of the display panel body while avoiding an overlap with the drive board in a front view of the display panel body; a controller which switches between an image display mode and a transmissive mode, the image display mode being a mode in which an image is displayed on the display panel body and the light control panel body is in the non-transmissive state, the transmissive mode being a mode in which an image is not displayed on the display panel body and the light control panel body is in the transmissive state; and a lead wire which electrically connects the electrode tab and the controller.

Advantageous Effects of Invention

According to the image display device in the present disclosure, it is possible to prevent the lead wires from interfering with the flexible boards.

DESCRIPTION OF EMBODIMENTS

Underlying Knowledge Forming Basis of the Present Disclosure

The inventors of the present disclosure have found that the following problems arise with respect to the technique described in the "Background Art" section.

In the conventional image display device described above, a drive board for driving the display panel is electrically connected to the outer peripheral portion of the display panel via a flexible board. Moreover, an electrode portion for supplying a predetermined voltage to the light control panel is disposed in the outer peripheral portion of the light control panel. A lead wire is electrically connected to the electrode portion.

However, in such a configuration, when the flexible board is curved and the drive board is folded back toward the light control panel, the lead wire interferes with the flexible board, which may damage the flexible board. In addition, the length for routing the lead wire is relatively long, which may have an influence, such as a noise, on other circuit boards.

Hereinafter, embodiments will be described in detail with reference to the drawings as appropriate. However, more detailed explanation than necessary may be omitted. For example, detailed explanations of already well-known matters and duplicate explanations for substantially the same configuration may be omitted. This is to avoid unnecessary redundancy of the following description and to facilitate the understanding of those skilled in the art.

It should be noted that the inventors provide the accompanying drawings and the following description in order for those skilled in the art to fully understand the present disclosure, and are not intended to limit the subject matter described in the claims by these.

Embodiment 1

Hereinafter, Embodiment 1 will be described with reference to FIG. 1 to FIG. 12. In FIG. 1 to FIG. 4 and FIG. 6 to FIG. 12, the width direction (left-right direction) of image display device 2 is defined as an X-axis direction, the depth direction of image display device 2 is defined as a Y-axis direction, and the height direction (top-bottom direction) of image display device 2 is defined as a Z-axis direction. Moreover, in the present description, the front surface refers to the surface on the negative Y-axis side, and the back surface refers to the surface on the positive Y-axis side.

1-1. Outline of Image Display Device

Figure 1:
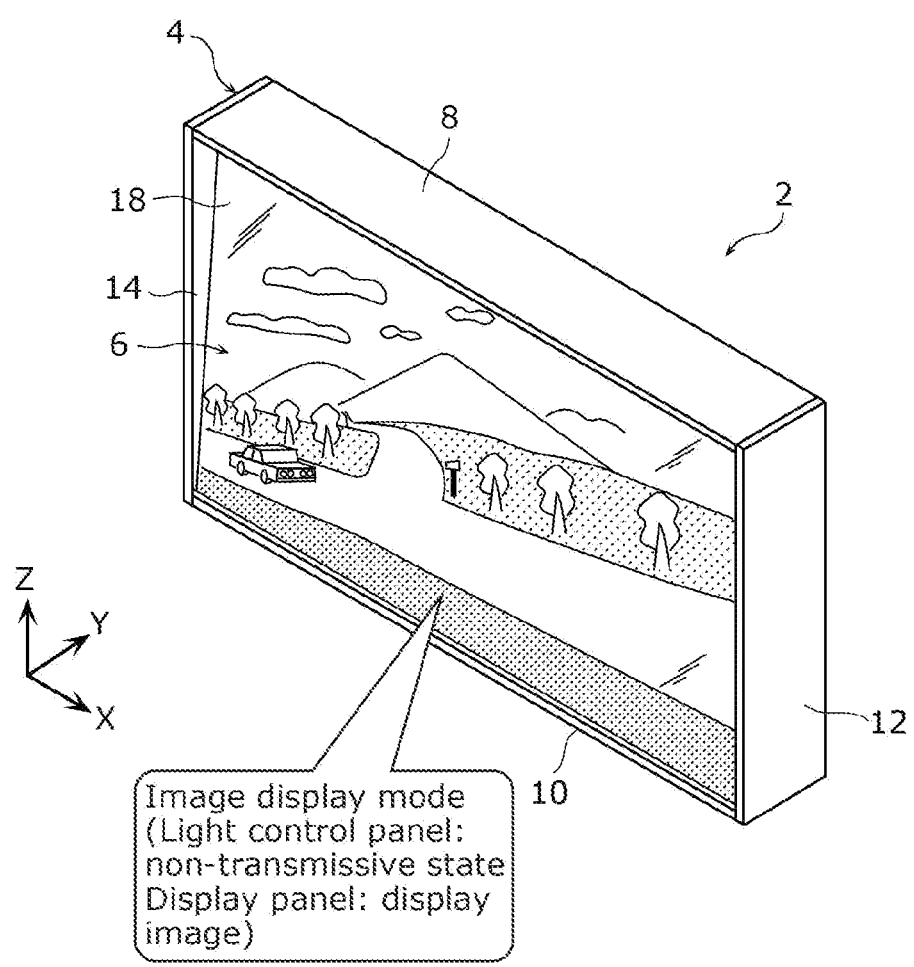
FIG. 1 is a perspective view of an image display device according to Embodiment 1 in an image display mode.
Figure 2:
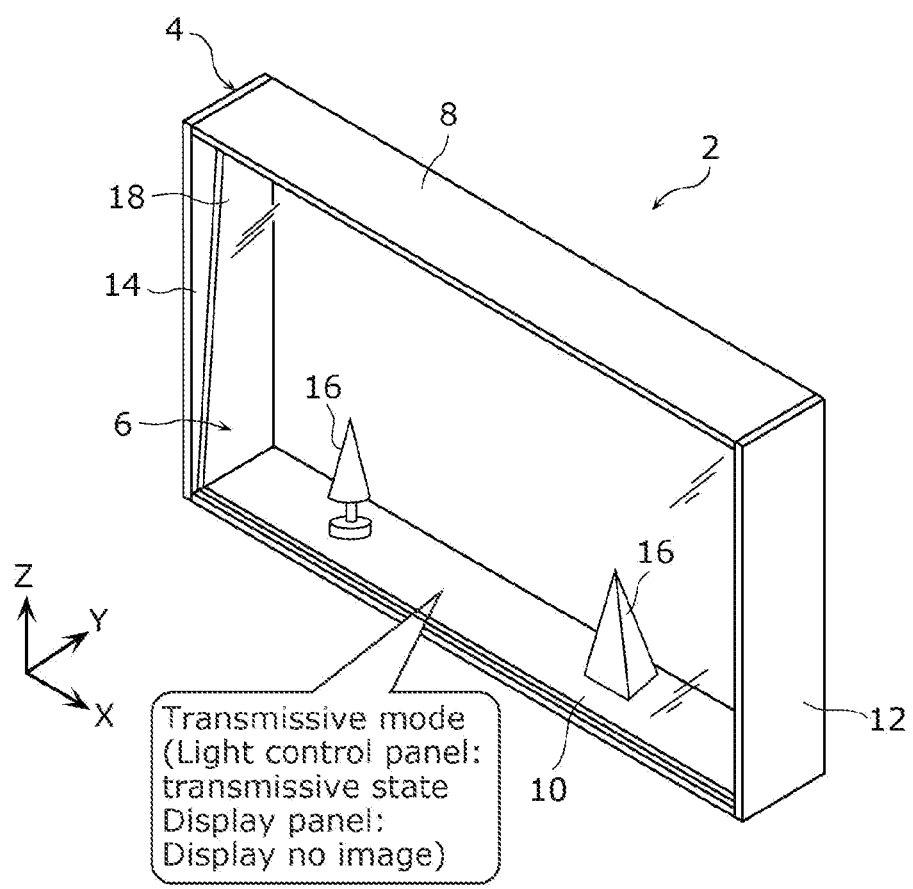
FIG. 2 is a perspective view of the image display device according to Embodiment 1 in a transmissive mode.
Figure 3:
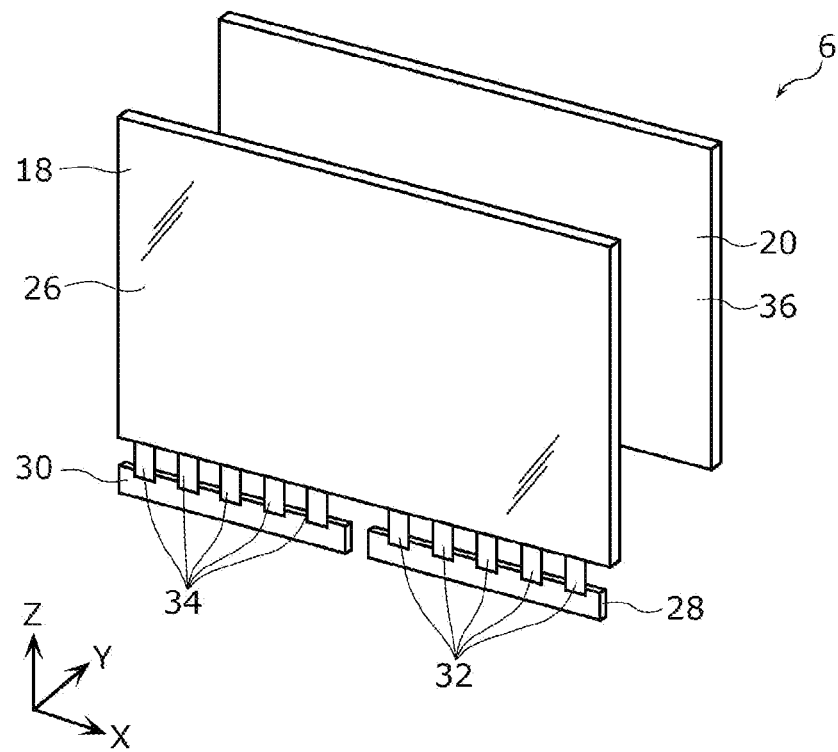
FIG. 3 is an exploded perspective view of a transparent display according to Embodiment 1.
Figure 4:
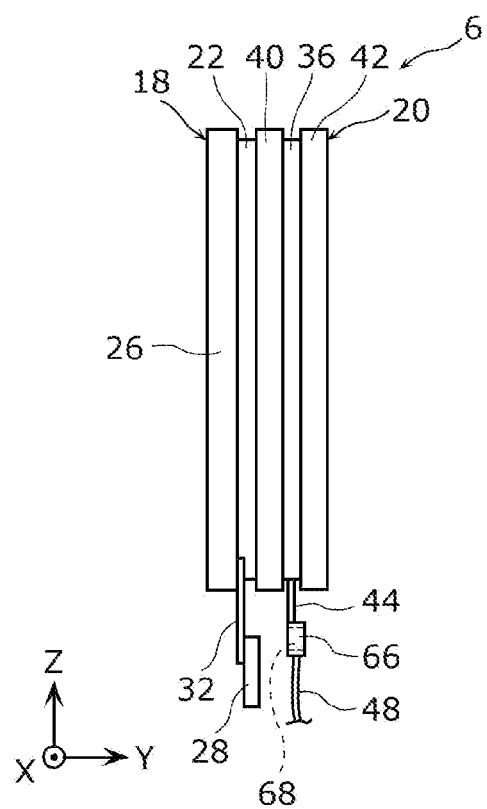
FIG. 4 is a side view of the transparent display according to Embodiment 1.
Figure 5:
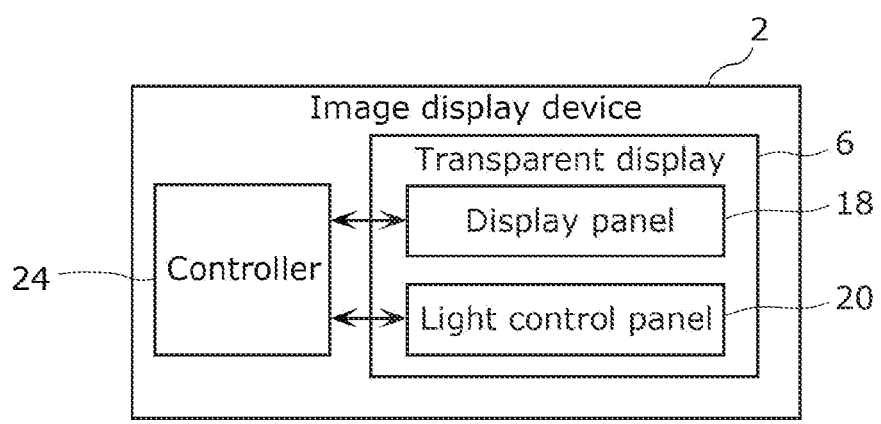
FIG. 5 is a block diagram of a functional configuration of the image display device according to Embodiment 1.

First, an outline of image display device 2 according to Embodiment 1 will be described with reference to FIG. 1 to FIG. 5. FIG. 1 is a perspective view of image display device 2 according to Embodiment 1 in an image display mode. FIG. 2 is a perspective view of image display device 2 according to Embodiment 1 in a transmissive mode. FIG. 3 is an exploded perspective view of transparent display 6 according to Embodiment 1. FIG. 4 is a side view of transparent display 6 according to Embodiment 1. FIG. 5 is a block diagram of a functional configuration of image display device 2 according to Embodiment 1.

As illustrated in FIG. 1 and FIG. 2, image display device 2 includes frame body 4 and transparent display 6.

As illustrated in FIG. 1 and FIG. 2, frame body 4 has a rectangular shape in an XZ plane view. Frame body 4 includes top wall 8, bottom wall 10, right side wall 12, and left side wall 14. Top wall 8 and bottom wall 10 are opposite to each other in the top-bottom direction (Z-axis direction). Right side wall 12 and left side wall 14 are opposite to each other in the left-right direction (X-axis direction). As illustrated in FIG. 2, objects 16, such as a photograph, a doll, a vase, a toy, a model, or a painting, are placed on the upper surface of bottom wall 10.

As illustrated in FIG. 1 and FIG. 2, transparent display 6 has a rectangular shape in an XZ plane view. The outer peripheral portion of transparent display 6 is supported by frame body 4. As illustrated in FIG. 2, objects 16 are placed so as to face the back surface of transparent display 6.

As illustrated in FIG. 3 and FIG. 4, transparent display 6 includes display panel 18 and light control panel 20 opposite to the back surface of display panel 18. As illustrated in FIG. 4, display panel 18 and light control panel 20 are pasted to each other by, for example, adhesive 22.

Display panel 18 includes, for example, an organic electro-luminescent (EL) panel. An image is displayed on the front surface of display panel 18. The "image" displayed on display panel 18 may be either a still image or a moving image, or may be video content including both a still image and a moving image.

Light control panel 20 is a light control panel using, for example, a polymer dispersed liquid crystal (PDLC) method or the like. Light control panel 20 is switched between a transmissive state where light is transmissive through light control panel 20 and a non-transmissive state where less light is transmissive through light control panel 20 than the transmissive state, depending on whether or not a predetermined voltage is applied to light control panel 20. Specifically, light control panel 20 is switched from the non-transmissive state to the transmissive state when a predetermined voltage is applied to light control panel 20, and is switched from the transmissive state to the non-transmissive state when the application of the predetermined voltage is stopped. In the transmissive state, light control panel 20 does not have to have a transparency that is a transmittance of 100%, and may have a transparency that is a transmittance of, for example, approximately 50% to 60%. Moreover, in the non-transmissive state, light control panel 20 does not have to have a transmittance of 0%, and may have a transmittance (for example, a transmittance of approximately 10%) lower than the transmittance in the transmissive state.

As illustrated in FIG. 5, image display device 2 includes transparent display 6 and controller 24 as a functional configuration.

Controller 24 switches transparent display 6 between the image display mode and the transmissive mode.

Specifically, in the image display mode illustrated in FIG. 1, controller 24 displays an image on display panel 18 and switches light control panel 20 to the non-transmissive state by not applying a predetermined voltage to light control panel 20. With this, light control panel 20 blocks the light on the back side of display panel 18. Accordingly, it is possible to prevent external light from entering the back surface of display panel 18, and display a clear image with a high contrast on display panel 18.

Moreover, in the transmissive mode illustrated in FIG. 2, controller 24 displays no image on display panel 18, and switches light control panel 20 to the transmissive state by applying a predetermined voltage to light control panel 20. As a result, the user is able to view objects 16 placed facing the back surface of transparent display 6 (the back surface of light control panel 20) through display panel 18 and light control panel 20 from the front.

1-2. Configuration of Display Panel

Figure 6:
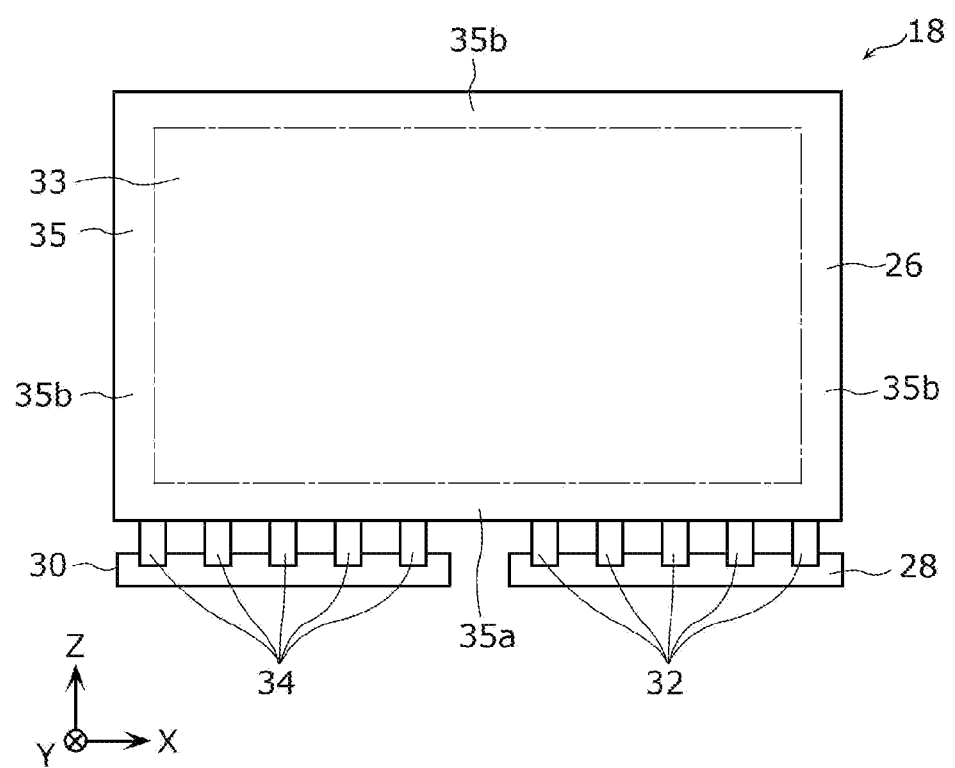
FIG. 6 is a plane view of a display panel according to Embodiment 1.

Next, a configuration of display panel 18 will be described with reference to FIG. 4 and FIG. 6. FIG. 6 is a plane view of display panel 18 according to Embodiment 1.

As illustrated in FIG. 6, display panel 18 includes display panel body 26, first drive board 28, second drive board 30, a plurality of first flexible boards 32, and a plurality of second flexible boards 34.

Display panel body 26 has a rectangular shape in an XZ plane view. In display panel body 26, organic EL elements, each of which includes an EL layer and a pair of transparent electrodes sandwiching the EL layer from both sides, are disposed in a matrix. An image is displayed on the front surface of display panel body 26.

Display panel body 26 includes display region 33 for displaying an image and frame region 35 which surrounds display region 33. Display region 33 has a rectangular shape in an XZ plane view. Frame region 35 is an inactive region for electrodes, sealing and the like, and is a frame-shaped region which does not contribute to the display of an image. Note that for illustrative purposes, in FIG. 6, the boundary between display region 33 and frame region 35 are indicated by a dashed-dotted line. Frame region 35 includes connection region 35a disposed along the lower side of display panel body 26 (an example of one side) and non-connection region 35b disposed along the upper side, right side, and left side of display panel body 26.

Each of first drive board 28 and second drive board 30 is an elongated source board for driving display panel body 26, and is electrically connected to controller 24 (see FIG. 5) described above. First drive board 28 and second drive board 30 are spaced apart from each other along the lower side of display panel body 26.

As illustrated in FIG. 4 and FIG. 6, the plurality of first flexible boards 32 are disposed at intervals along the lengthwise direction (X-axis direction) of first drive board 28, and electrically connect connection region 35a of display panel body 26 and first drive board 28. The plurality of second flexible boards 34 are disposed at intervals along the lengthwise direction (X-axis direction) of second drive board 30, and electrically connect connection region 35a of display panel body 26 and second drive board 30.

1-3. Configuration of Light Control Panel

Figure 7:
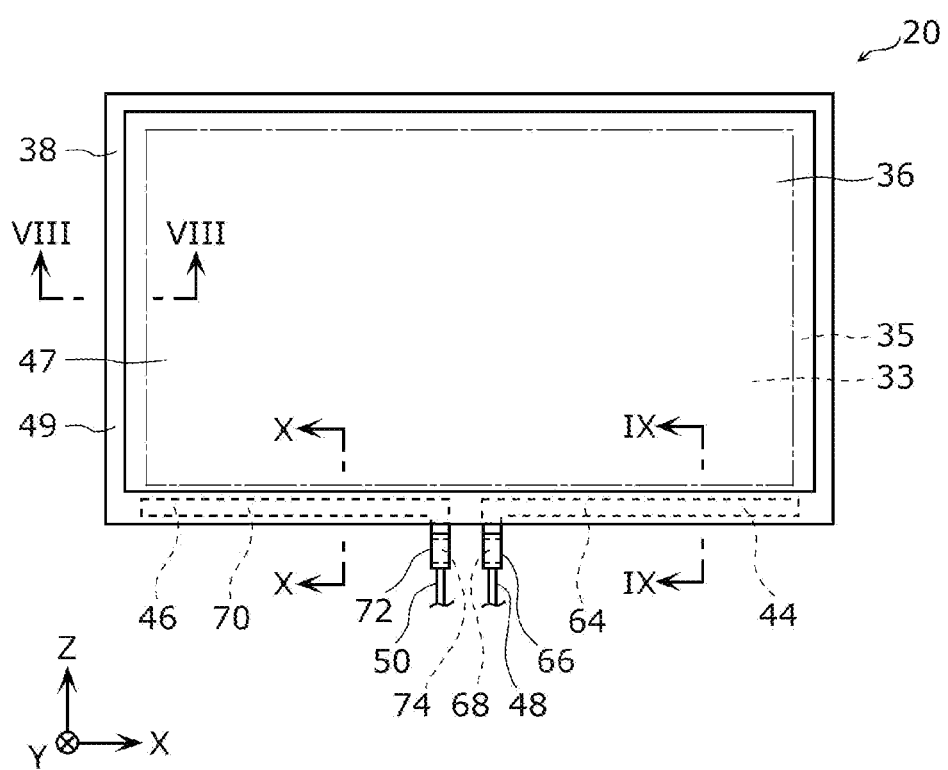
FIG. 7 is a plane view of a light control panel according to Embodiment 1.
Figure 8:
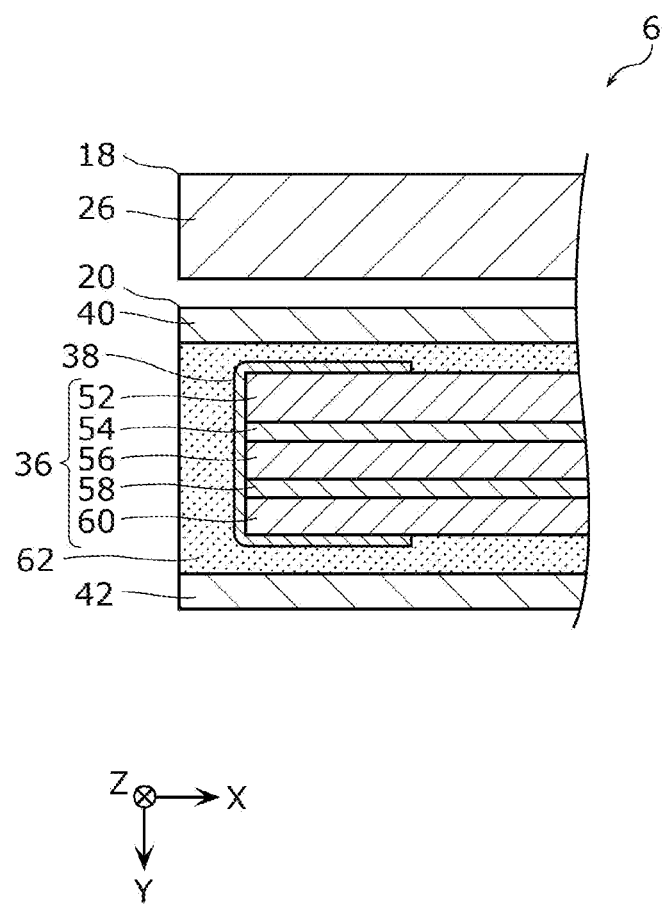
FIG. 8 is a cross-sectional view of relevant portions of the transparent display according to Embodiment 1 taken along line VIII-VIII of FIG. 7.
Figure 9:
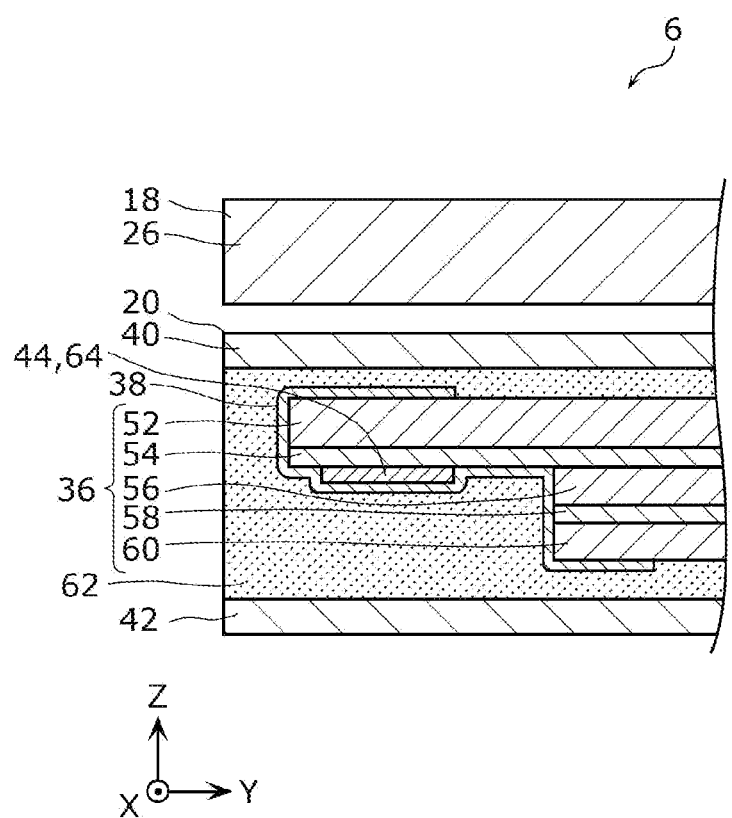
FIG. 9 is a cross-sectional view of relevant portions of the transparent display according to Embodiment 1 taken along line IX-IX of FIG. 7.
Figure 10:
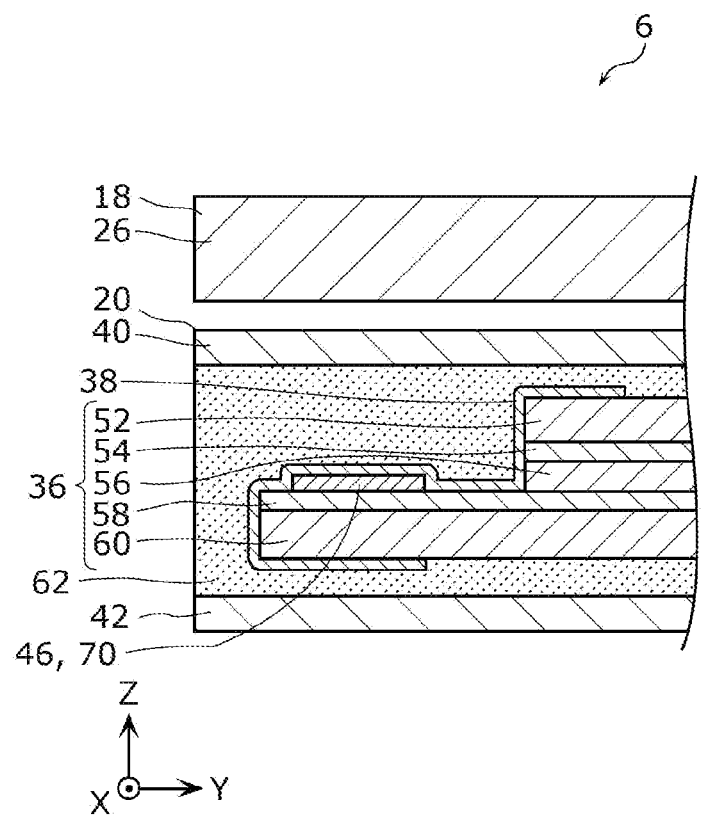
FIG. 10 is a cross-sectional view of relevant portions of the transparent display according to Embodiment 1 taken along line X-X of FIG. 7.
Figure 11:
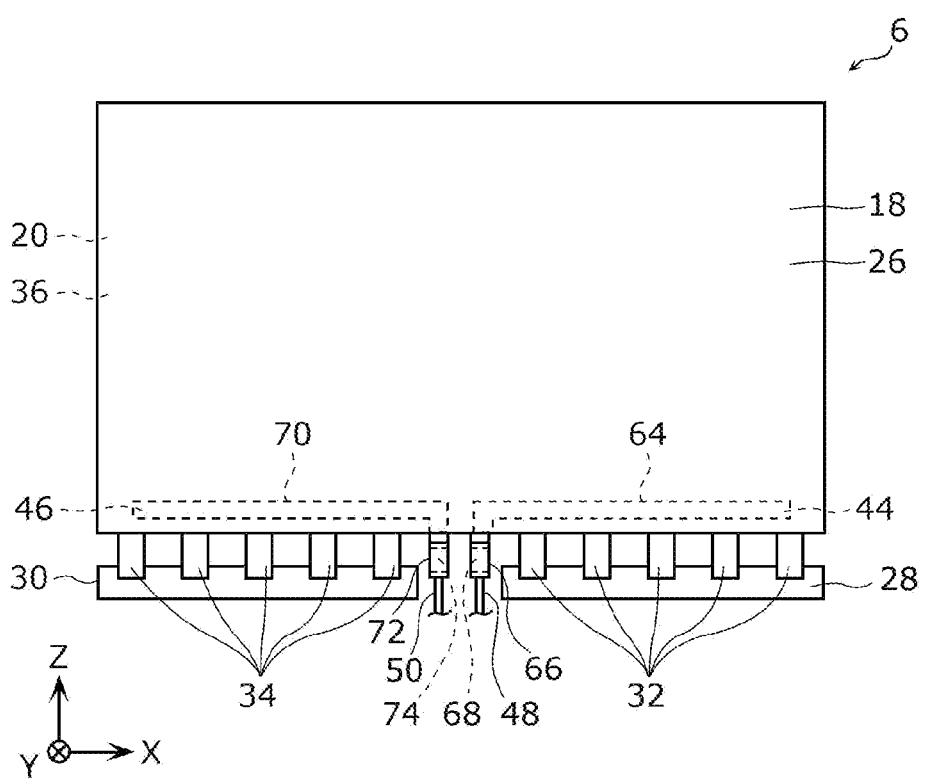
FIG. 11 is a plane view of the transparent display according to Embodiment 1.
Figure 12:
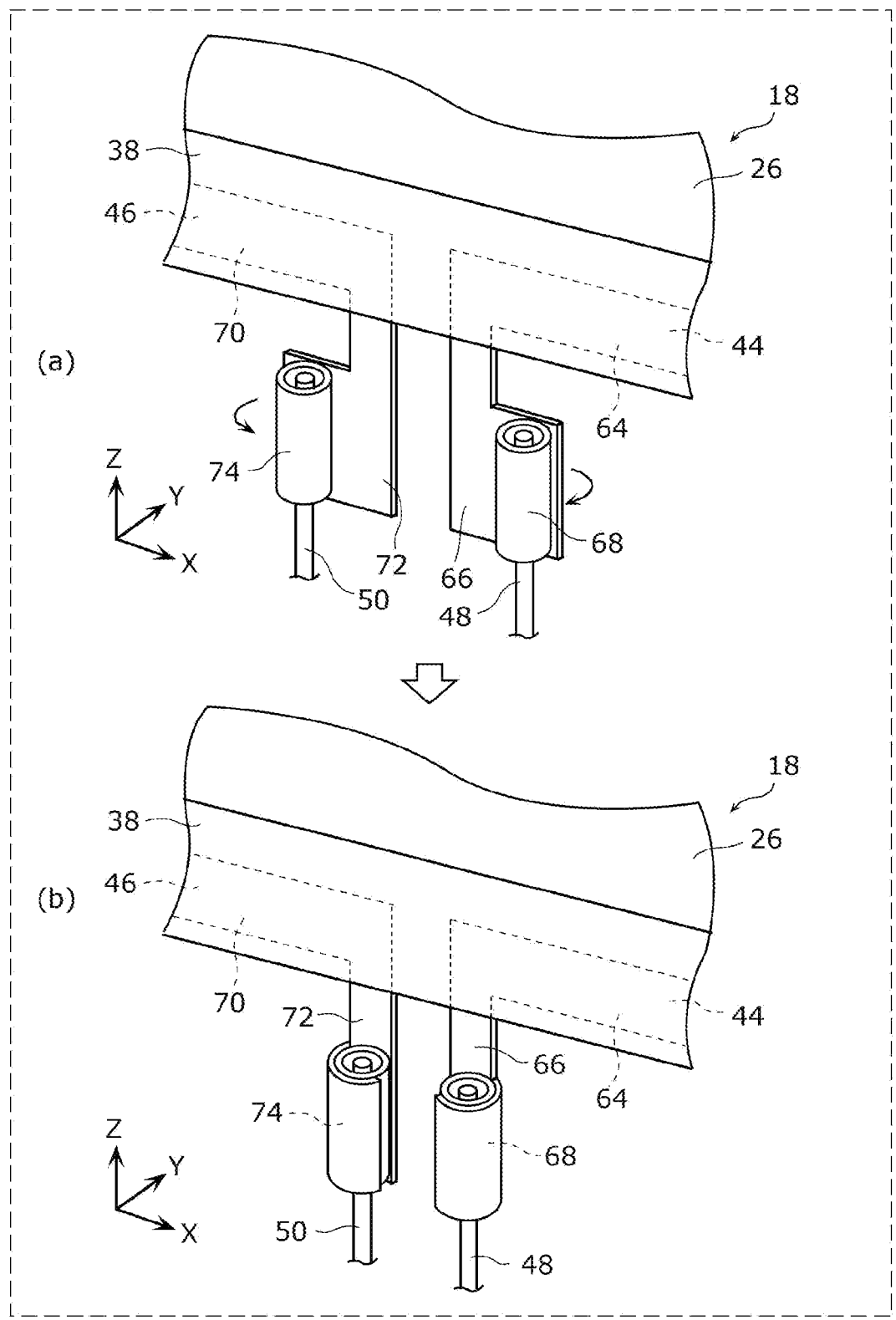
FIG. 12 is an enlarged perspective view of a first electrode tab and a second electrode tab of the light control panel according to Embodiment 1.

Next, a configuration of light control panel 20 will be described with reference to FIG. 4 and FIG. 7 to FIG. 12. FIG. 7 is a plane view of light control panel 20 according to Embodiment 1. FIG. 8 is a cross-sectional view of relevant portions of transparent display 6 according to Embodiment 1 taken along line VIII-VIII of FIG. 7. FIG. 9 is a cross-sectional view of relevant portions of transparent display 6 according to Embodiment 1 taken along line IX-IX of FIG. 7. FIG. 10 is a cross-sectional view of relevant portions of transparent display 6 according to Embodiment 1 taken along line X-X of FIG. 7. FIG. 11 is a plane view of transparent display 6 according to Embodiment 1. FIG. 12 is an enlarged perspective view of first electrode tab 66 and second electrode tab 72 of light control panel 20 according to Embodiment 1. For illustrative purposes, first glass plate 40 is not illustrated in FIG. 7.

As illustrated in FIG. 4 and FIG. 7, light control panel 20 includes light control panel body 36, sealing member 38, first glass plate 40, second glass plate 42, first electrode portion 44, second electrode portion 46, first lead wire 48, and second lead wire 50.

As illustrated in FIG. 7, light control panel body 36 has a rectangular shape in an XZ plane view. Light control panel body 36 includes light control region 47 switchable between the transmissive state and the non-transmissive state, and peripheral region 49 which surrounds light control region 47. Light control region 47 has a rectangular shape in an XZ plane view. Peripheral region 49 is a frame-shaped region which does not contribute to light control. As illustrated in FIG. 7, in the XZ plane view, peripheral region 49 overlaps with frame region 35 of display panel body 26. In FIG. 7, the boundary between display region 33 and frame region 35 of display panel body 26 when display panel body 26 and light control panel body 36 are layered is indicated by a dashed-dotted line.

As illustrated in FIG. 7, sealing member 38 is a sealing tape for sealing the outer peripheral portion of light control panel body 36 for the purpose of preventing electric shock, waterproofing, and the like. Sealing member 38 is pasted so as to cover the entire periphery of peripheral region 49 of light control panel body 36. In the cross sections illustrated in FIG. 8 to FIG. 10, sealing member 38 is pasted in a state of being folded back in a generally U-shape from the front surface to the back surface of light control panel body 36 via the lateral surface of light control panel body 36.

As illustrated in FIG. 8 to FIG. 10, light control panel body 36 includes, from the side closer to display panel 18, first transparent base material 52, first transparent electrode layer 54, light control layer 56, second transparent electrode layer 58, and second transparent base material 60 which are stacked in the mentioned order.

First transparent electrode layer 54 and second transparent electrode layer 58 are opposite to each other, and sandwich light control layer 56 from both sides. A predetermined voltage applied to first electrode portion 44 and second electrode portion 46 is applied to first transparent electrode layer 54 and second transparent electrode layer 58. Each of first transparent electrode layer 54 and second transparent electrode layer 58 includes, for example, indium tin oxide (ITO) or the like.

Light control layer 56 is disposed between first transparent electrode layer 54 and second transparent electrode layer 58. Light control layer 56 is switched between the transmissive state and the non-transmissive state depending on whether or not a predetermined voltage is applied to first transparent electrode layer 54 and second transparent electrode layer 58. Specifically, light control layer 56 is switched from the non-transmissive state to the transmissive state when a predetermined voltage is applied to light control layer 56, and is switched from the transmissive state to the non-transmissive state when the application of the predetermined voltage is stopped. Light control layer 56 also has a function as an insulating layer for electrically insulating first transparent electrode layer 54 from second transparent electrode layer 58.

First transparent base material 52 and second transparent base material 60 are base materials for protecting first transparent electrode layer 54 and second transparent electrode layer 58, respectively. First transparent base material 52 and second transparent base material 60 are disposed so as to cover first transparent electrode layer 54 and second transparent electrode layer 58 from the outside, respectively. Each of first transparent base material 52 and second transparent base material 60 includes, for example, a transparent resin such as polyethylene terephthalate (PET).

As illustrated in FIG. 4 and FIG. 8 to FIG. 10, first glass plate 40 and second glass plate 42 are opposite to each other, and sandwich light control panel body 36 from both sides.

First glass plate 40 is opposite to first transparent base material 52 of light control panel body 36, and second glass plate 42 is opposite to second transparent base material 60 of light control panel body 36. Each of first glass plate 40 and second glass plate 42 is bonded to light control panel body 36 by adhesive resin 62.

As illustrated in FIG. 7, first electrode portion 44 and second electrode portion 46 are disposed in peripheral region 49 of light control panel body 36, and are spaced apart from each other along the lower side of display panel body 26. Each of first electrode portion 44 and second electrode portion 46 is made of a conductive tape such as a copper foil tape.

As illustrated in FIG. 7, first electrode portion 44 includes first electrode body 64 and first electrode tab 66. First electrode body 64 is elongated along the lower side of display panel body 26. First electrode tab 66 extends approximately perpendicular to the lengthwise direction (X-axis direction) of first electrode body 64 from one lengthwise end portion of first electrode body 64 (the end portion of first electrode body 64 opposite to second electrode body 70). In other words, first electrode portion 44 includes a generally L-shape as a whole. In the XZ plane view, first electrode portion 44 overlaps with connection region 35a of frame region 35 of display panel body 26.

As illustrated in FIG. 9, at the portion in the outer peripheral portion of light control panel body 36 where first electrode portion 44 is disposed, one end portion of each of second transparent base material 60, second transparent electrode layer 58, and light control layer 56 is cut out, so that first transparent electrode layer 54 is exposed to the outside of light control panel body 36. First electrode body 64 is pasted to first transparent electrode layer 54 that is exposed via a silver paste.

First electrode body 64 is sealed by sealing member 38 described above. When sealing member 38 is pasted to the portion where first electrode tab 66 is disposed, in a state where sealing member 38 includes a pair of cuts along the both edges of first electrode tab 66, sealing member 38 may be folded back in a generally U-shape along the outer peripheral portion of light control panel body 36 on each side of first electrode tab 66.

As illustrated in FIG. 7, second electrode portion 46 includes second electrode body 70 and second electrode tab 72. Second electrode body 70 is elongated along the lower side of display panel body 26. In other words, first electrode body 64 and second electrode body 70 are spaced apart from each other along the lower side of display panel body 26. Second electrode tab 72 extends approximately perpendicularly to the lengthwise direction (X-axis direction) of second electrode body 70 from one lengthwise end portion of second electrode body 70 (the end portion of second electrode body 70 opposite to first electrode body 64). In other words, second electrode portion 46 has a generally L-shape as a whole. In the XZ plane view, second electrode portion 46 overlaps with connection region 35a of frame region 35 of display panel body 26.

As illustrated in FIG. 10, at the portion in the outer peripheral portion of light control panel body 36 where second electrode portion 46 is disposed, one end portion of each of first transparent base material 52, first transparent electrode layer 54, and light control layer 56 is cut out, so that second transparent electrode layer 58 is exposed to the outside of light control panel body 36. Second electrode body 70 is pasted to second transparent electrode layer 58 that is exposed via a silver paste.

Second electrode body 70 is sealed by sealing member 38 described above. When sealing member 38 is pasted to the portion where second electrode tab 72 is disposed, in a state where sealing member 38 includes a pair of cuts along the both edges of second electrode tab 72, sealing member 38 may be folded back in a generally U-shape along the outer peripheral portion of light control panel body 36 on each side of second electrode tab 72.

As illustrated in FIG. 11, first electrode tab 66 and second electrode tab 72 are disposed at corresponding positions between first drive board 28 and second drive board 30, and extend between first drive board 28 and second drive board 30. In other words, in the front view of display panel body 26 (in an XZ plane view), first electrode tab 66 extends from first electrode body 64 crossing the lower side of display panel body 26 while avoiding an overlap with first drive board 28 and second drive board 30. Moreover, in the front view of display panel body 26, second electrode tab 72 extends from second electrode body 70 crossing the lower side of display panel body 26 while avoiding an overlap with first drive board 28 and second drive board 30.

As illustrated in (a) and (b) of FIG. 12, first electrode tab 66 has a generally L-shape, and is wound around the outer peripheral surface of tubular first metal sleeve 68 along the lengthwise direction of first electrode body 64. At this time, first metal sleeve 68 is crimped while covering one end portion of first lead wire 48, and is fixed to first electrode tab 66 by a double-sided adhesive tape (not illustrated). Although not illustrated, first electrode tab 66 wound around the outer peripheral surface of first metal sleeve 68 may be folded back toward second glass plate 42 and fixed onto second glass plate 42 with an insulating tape.

As illustrated in (a) and (b) of FIG. 12, second electrode tab 72 has a generally L-shape, and is wound around the outer peripheral surface of tubular second metal sleeve 74 along the lengthwise direction of second electrode body 70. At this time, second metal sleeve 74 is crimped while covering one end portion of second lead wire 50, and is fixed to second electrode tab 72 by a double-sided adhesive tape (not illustrated). Although not illustrated, second electrode tab 72 wound around the outer peripheral surface of second metal sleeve 74 may be folded back toward second glass plate 42 and fixed onto second glass plate 42 with an insulating tape.

As illustrated in FIG. 11, first lead wire 48 extends downward (in the negative Z-axis direction) from first electrode tab 66 of first electrode portion 44 between first drive board 28 and second drive board 30, and electrically connects first electrode portion 44 and controller 24 (see FIG. 5). Moreover, second lead wire 50 extends downward from second electrode tab 72 of second electrode portion 46 between first drive board 28 and second drive board 30, and electrically connects second electrode portion 46 and controller 24.

As a result, a predetermined voltage from controller 24 is applied to first transparent electrode layer 54 via first lead wire 48, first metal sleeve 68, first electrode tab 66, and first electrode body 64, and to second transparent electrode layer 58 via second lead wire 50, second metal sleeve 74, second electrode tab 72, and second electrode body 70.

1-4. Advantageous Effects

The advantageous effects obtained by the present embodiment will be described while comparing transparent display 6 according to Embodiment 1 with transparent display 100 according to a comparative example.

Figure 13:
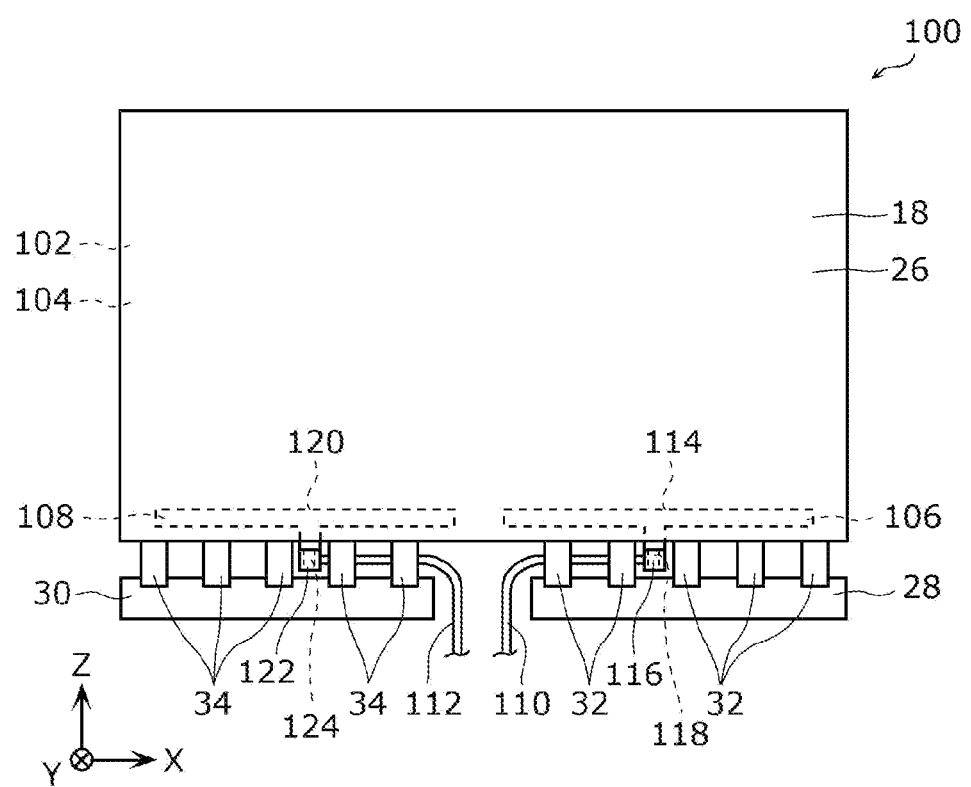
FIG. 13 is a plane view of a transparent display according to a comparative example.
Figure 14:
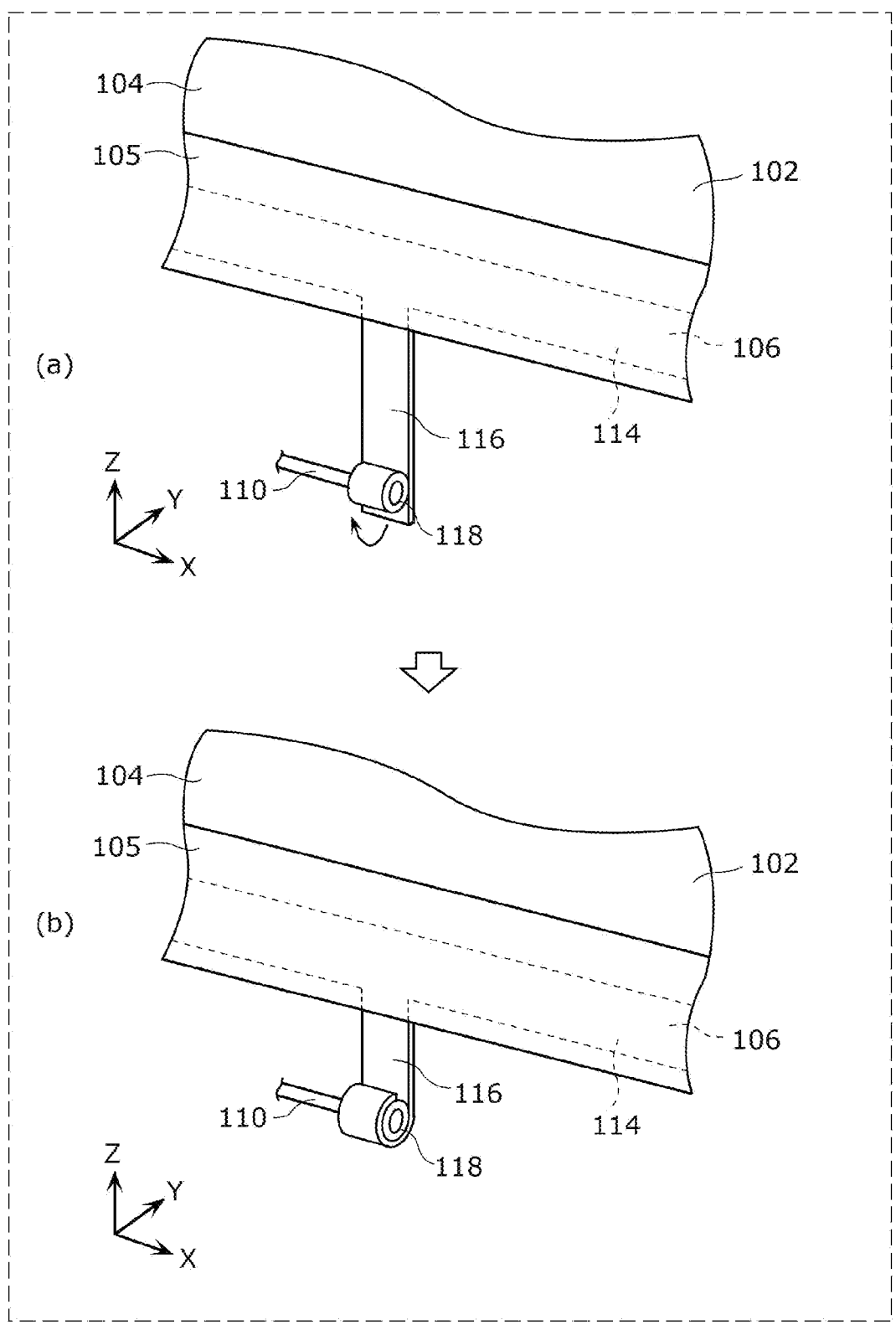
FIG. 14 is an enlarged perspective view of a first electrode tab of a light control panel according to the comparative example.

First, a configuration of transparent display 100 according to a comparative example will be described with reference to FIG. 13 and FIG. 14. FIG. 13 is a plane view of transparent display 100 according to the comparative example. FIG. 14 is an enlarged perspective view of first electrode tab 116 of light control panel 102 according to the comparative example. In FIG. 13 and FIG. 14, the structural elements that are the same as those of transparent display 6 according to Embodiment 1 share the same reference numerals, and as such, the description thereof will be omitted.

As illustrated in FIG. 13, light control panel 102 of transparent display 100 according to the comparative example includes light control panel body 104, sealing member 105 (see FIG. 14), first glass plate (not illustrated), second glass plate (not illustrated), first electrode portion 106, second electrode portion 108, first lead wire 110, and second lead wire 112.

First electrode portion 106 and second electrode portion 108 are disposed in the outer peripheral portion of light control panel body 104, and are spaced apart from each other along the lower side of display panel body 26.

First electrode portion 106 includes first electrode body 114 and first electrode tab 116. First electrode body 114 is elongated along the lower side of display panel body 26. First electrode tab 116 extends approximately perpendicularly to the lengthwise direction (X-axis direction) of first electrode body 114 from the lengthwise central portion of first electrode body 114. In other words, first electrode portion 106 has a generally T-shape as a whole.

Second electrode portion 108 includes second electrode body 120 and second electrode tab 122. Second electrode body 120 is elongated along the lower side of display panel body 26. Second electrode tab 122 extends approximately perpendicularly to the lengthwise direction (X-axis direction) of second electrode body 120 from the lengthwise central portion of second electrode body 120. In other words, second electrode portion 108 has a generally T-shape as a whole.

As illustrated in (a) and (b) of FIG. 14, first electrode tab 116 has a strip shape, and is wound around the outer peripheral surface of tubular first metal sleeve 118 along the widthwise direction (Z-axis direction) of first electrode body 114. At this time, first metal sleeve 118 is crimped while covering one end portion of first lead wire 110.

Although not illustrated, second electrode tab 122 has a strip shape, and is wound around the outer peripheral surface of tubular second metal sleeve 124 along the widthwise direction (Z-axis direction) of second electrode body 120. At this time, second metal sleeve 124 is crimped while covering one end portion of second lead wire 112.

As illustrated in FIG. 13, first electrode tab 116 is disposed at a position corresponding to the lengthwise central portion of first drive board 28, and second electrode tab 122 is disposed at a position corresponding to the lengthwise central portion of second drive board 30. As a result, first lead wire 110 extends laterally (in the negative X-axis direction) from first electrode tab 116 of first electrode portion 106, and second lead wire 112 extends laterally (in the positive X-axis direction) from second electrode tab 122 of second electrode portion 108.

However, in such a configuration, when first flexible boards 32 are curved and first drive board 28 is folded back toward light control panel 102, first lead wire 110 interferes with first flexible boards 32, which may damage first flexible boards 32. Similarly, when second flexible boards 34 are curved and second drive board 30 is folded back toward light control panel 20, second lead wire 112 interferes with second flexible boards 34, which may damage second flexible boards 34.

In addition, the length for routing first lead wire 110 from first electrode tab 116 and the length for routing second lead wire 112 from second electrode tab 122 are relatively long. This may have an influence, such as a noise, on other circuit boards.

On the other hand, in the present embodiment, as described above, image display device 2 includes display panel body 26 which displays an image on the front surface of display panel body 26; drive boards (first drive board 28 and second drive board 30) disposed along one side of display panel body 26 to drive display panel body 26; flexible boards (first flexible boards 32 and second flexible boards 34) which electrically connect display panel body 26 and the drive boards (first drive board 28 and second drive board 30); light control panel body 36 which faces the back surface of display panel body 26, and is switchable between a transmissive state where light is transmissive through light control panel body 36 and a non-transmissive state where less light is transmissive through light control panel body 36 than the transmissive state; first electrode portion 44 (second electrode portion 46) which includes first electrode body 64 (second electrode body 70) disposed in the outer peripheral portion of light control panel body 36 along one side of display panel body 26 and first electrode tab 66 (second electrode tab 72) which extends from first electrode body 64 (second electrode body 70) crossing one side of display panel body 26 while avoiding an overlap with drive boards (first drive board 28 and second drive board 30) in the front view of display panel body 26; controller 24 which switches between an image display mode in which an image is displayed on display panel body 26 and light control panel body 36 is in the non-transmissive state and a transmissive mode in which an image is not displayed on display panel body 26 and light control panel body 36 is in the transmissive state; first lead wire 48 (second lead wire 50) which electrically connects first electrode tab 66 (second electrode tab 72) and controller 24.

With this, first electrode tab 66 (second electrode tab 72) extends from first electrode body 64 (second electrode body 70) crossing one side of display panel body 26 while avoiding an overlap with the drive boards (first drive board 28 and second drive board 30) in the front view of display panel body 26. Hence, when first flexible boards 32 (second flexible boards 34) are curved and first drive board 28 (second drive board 30) is folded back toward light control panel 20, it is possible to prevent first lead wire 48 (second lead wire 50) from interfering with first flexible boards 32 (second flexible boards 34), which prevents first flexible boards 32 (second flexible boards 34) from being damaged. In addition, the length for routing first lead wire 48 (second lead wire 50) from first electrode tab 66 (second electrode tab 72) is relatively short. This reduces an influence of noise or the like on other circuit boards and the like.

Moreover, in the present embodiment, the drive board includes first drive board 28 and second drive board 30 spaced apart from each other along one side of display panel body 26. The flexible board includes first flexible boards 32 which electrically connect display panel body 26 and first drive board 28 and second flexible boards 34 which electrically connect display panel body 26 and second drive board 30. The electrode portion includes first electrode portion 44 and second electrode portion 46. First electrode body 64 of first electrode portion 44 and second electrode body 70 of second electrode portion 46 are elongated along one side of display panel body 26, and are spaced apart from each other. First electrode tab 66 of first electrode portion 44 extends from one lengthwise end portion of first electrode body 64 toward a portion between first drive board 28 and second drive board 30, and second electrode tab 72 of second electrode portion 46 extends from one lengthwise end portion of second electrode body 70 toward a portion between first drive board 28 and second drive board 30.

With this, when first flexible boards 32 are curved and first drive board 28 is folded back toward light control panel 20, it is possible to prevent first lead wire 48 from interfering with first flexible boards 32. Moreover, when second flexible boards 34 are curved and second drive board 30 is folded back toward light control panel 20, it is possible to prevent second lead wire 50 from interfering with second flexible boards 34. As a result, it is possible to prevent first flexible boards 32 and second flexible boards 34 from being damaged.

Moreover, in the present embodiment, image display device 2 further includes tubular first metal sleeve 68 (second metal sleeve 74) crimped while covering one end portion of first lead wire 48 (second lead wire 50) and wound around first electrode tab 66 (second electrode tab 72) along the lengthwise direction of first electrode body 64 (second electrode body 70).

With this, first electrode tab 66 of first lead wire 48 can be extended in the widthwise direction of first electrode body 64. Moreover, second electrode tab 72 of second lead wire 50 can be extended in the widthwise direction of second electrode body 70. As a result, the distance between first electrode tab 66 and second electrode tab 72 can be made relatively short, and the length for routing first lead wire 48 and the length for routing second lead wire 50 can be further reduced.

Embodiment 2

2-1. Configuration of Transparent Display

Figure 15:
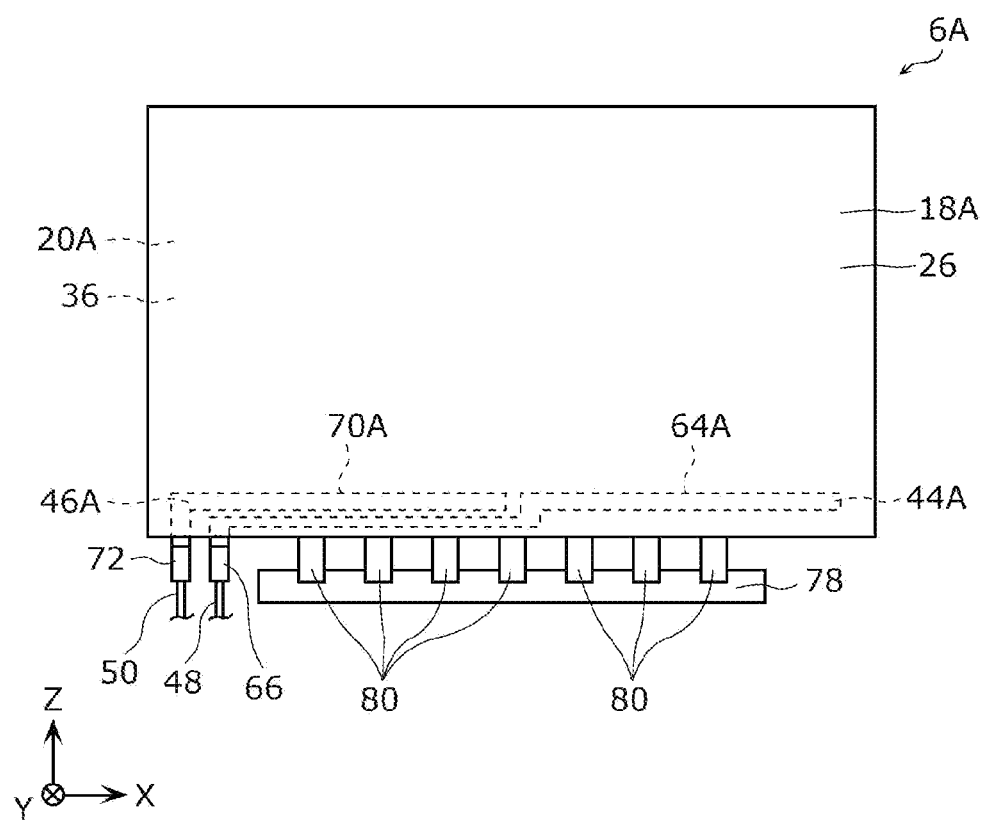
FIG. 15 is a plane view of a transparent display according to Embodiment 2.

A configuration of transparent display 6A according to Embodiment 2 will be described with reference to FIG. 15. FIG. 15 is a plane view of transparent display 6A according to Embodiment 2. In the present embodiment, the structural elements that are the same as those in Embodiment 1 share the same reference numerals, and as such, the description thereof will be omitted.

As illustrated in FIG. 15, in transparent display 6A according to Embodiment 2, the number of drive boards of display panel 18A is different from that of Embodiment 1. Specifically, display panel 18A includes display panel body 26, drive board 78, and a plurality of flexible boards 80.

Drive board 78 is disposed along the lower side of display panel body 26. The plurality of flexible boards 80 are disposed at intervals along the lengthwise direction (X-axis direction) of drive board 78, and electrically connect connection region 35a (see FIG. 6) of display panel body 26 and drive board 78.

As illustrated in FIG. 15, in transparent display 6A according to Embodiment 2, the configurations of first electrode portion 44A and second electrode portion 46A of light control panel 20A are different from those of Embodiment 1. Specifically, first electrode portion 44A and second electrode portion 46A are disposed in peripheral region 49 (see FIG. 7) of light control panel body 36 along the lower side of display panel body 26.

First electrode body 64A of first electrode portion 44A is elongated from the vicinity of one end portion (right side end portion in FIG. 15) to the vicinity of the other end portion (left side end portion in FIG. 15) of the lower side of display panel body 26. Second electrode body 70A of second electrode portion 46A is elongated from the central portion to the vicinity of the other end portion of the lower side of display panel body 26.

In the front view of display panel body 26, first electrode tab 66 of first electrode portion 44A extends from one lengthwise end portion of first electrode body 64A crossing the lower side of display panel body 26 while avoiding an overlap with drive board 78, and is disposed on one side (left side in FIG. 15) of drive board 78. In the front view of display panel body 26, second electrode tab 72 of second electrode portion 46A extends from one lengthwise end portion of second electrode body 70A crossing the lower side of display panel body 26 while avoiding an overlap with drive board 78, and is disposed on the one side of drive board 78. In other words, both first electrode tab 66 and second electrode tab 72 are disposed on one side of drive board 78.

2-2. Advantageous Effects

In the present embodiment, the electrode portion includes first electrode portion 44A and second electrode portion 46A. First electrode body 64A of first electrode portion 44A and second electrode body 70A of second electrode portion 46A are elongated along one side of display panel body 26. First electrode tab 66 of first electrode portion 44A and second electrode tab 72 of second electrode portion 46A respectively extend from one lengthwise end portion of first electrode body 64A and one lengthwise end portion of second electrode body 70A crossing one side of display panel body 26 while avoiding an overlap with drive board 78, and are disposed on one side of drive board 78.

With this, the same advantageous effects as those of Embodiment 1 can be obtained.

Embodiment 3

3-1. Configuration of Transparent Display

Figure 16:
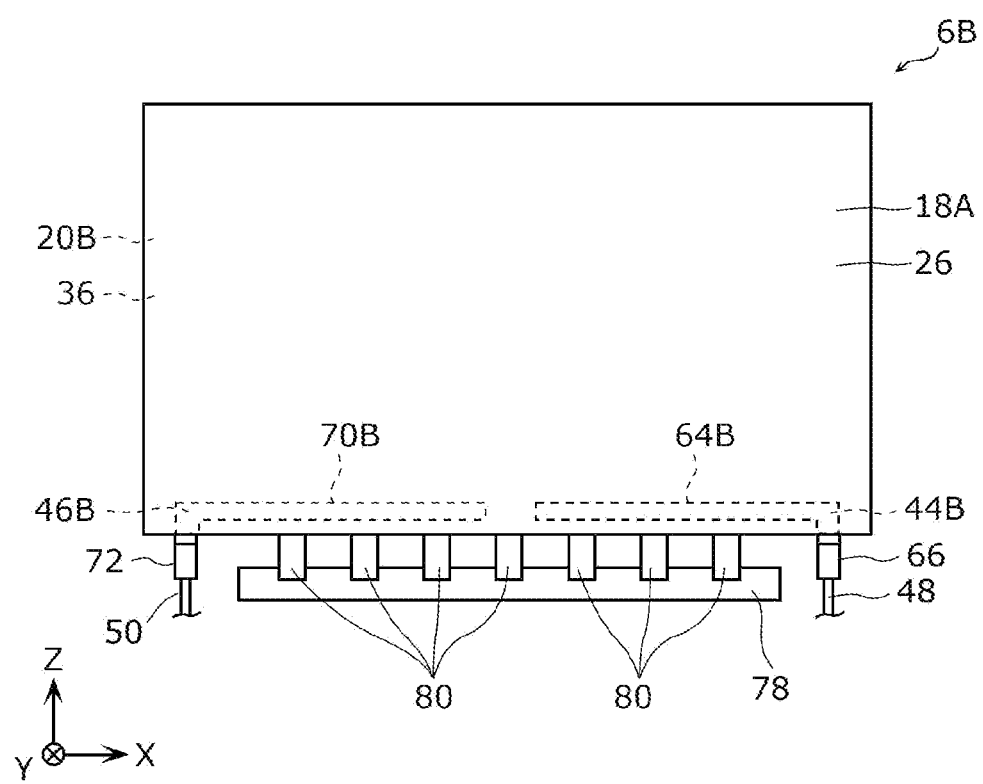
FIG. 16 is a plane view of a transparent display according to Embodiment 3.

A configuration of transparent display 6B according to Embodiment 3 will be described with reference to FIG. 16. FIG. 16 is a plane view of transparent display 6B according to Embodiment 3. In the present embodiment, the structural elements that are the same as those in Embodiment 1 and Embodiment 2 share the same reference numerals, and as such, the description thereof will be omitted.

As illustrated in FIG. 16, in transparent display 6B according to Embodiment 3, a configuration of display panel 18A is the same as that of Embodiment 2, but the configurations of first electrode portion 44B and second electrode portion 46B of light control panel 20B are different from those of Embodiment 2.

Specifically, first electrode portion 44B and second electrode portion 46B are disposed in peripheral region 49 of light control panel body 36 (see FIG. 7), and are spaced apart from each other along the lower side of display panel body 26. First electrode body 64B of first electrode portion 44B is elongated from the central portion to the vicinity of one end portion (the right side end portion in FIG. 16) of the lower side of display panel body 26. Second electrode body 70B of second electrode portion 46B is elongated from the central portion to the vicinity of the other end portion (the left side end portion in FIG. 16) of the lower side of display panel body 26.

First electrode tab 66 of first electrode portion 44B extends from one lengthwise end portion of first electrode body 64B (the end portion farther from second electrode portion 46B) crossing the lower side of display panel body 26 while avoiding an overlap with drive board 78 in the front view of display panel body 26, and is disposed on one side (right side in FIG. 16) of drive board 78. Second electrode tab 72 of second electrode portion 46B extends from one lengthwise end portion of second electrode body 70B (the end portion farther from first electrode portion 44B) crossing the lower side of display panel body 26 while avoiding an overlap with drive board 78 in the front view of display panel body 26, and is disposed on the other side (left side in FIG. 16) of drive board 78. In other words, first electrode tab 66 and second electrode tab 72 are disposed on opposite sides of drive board 78.

3-2. Advantageous Effects

In the present embodiment, the electrode portion includes first electrode portion 44B and second electrode portion 46B. First electrode body 64B of first electrode portion 44B and second electrode body 70B of second electrode portion 46B are elongated along one side of display panel body 26, and are spaced apart from each other. First electrode tab 66 of first electrode portion 44B and second electrode tab 72 of second electrode portion 46B respectively extend from one lengthwise end portion of first electrode body 64B and one lengthwise end portion of second electrode body 70B crossing one side of display panel body 26 while avoiding an overlap with drive board 78, and are disposed on opposite sides of drive board 78.

With this, the same advantageous effects as those of Embodiment 1 can be obtained.

Other Embodiments

As described above, the embodiments have been described as examples of the technique disclosed in the present application. However, the technique in the present disclosure is not limited to such examples, and can be applied to embodiments in which changes, replacements, additions, omissions, etc. are made as appropriate. It is also possible to combine the structural elements described in the above embodiments to form a new embodiment.

Accordingly, another embodiment will be illustrated below.

In each of the above embodiments, display panel 18 (18A) includes an organic EL panel, but the present disclosure is not limited to such an example, and an arbitrary self-luminous display panel such as an inorganic EL panel may be used.

The embodiments have been described above as examples of the technique disclosed in the present application. To that end, the accompanying drawings and detailed explanations have been provided.

Accordingly, among the structural elements described in the attached drawings and the detailed description, not only the structural elements essential for solving the problem but also the structural elements not essential for solving the problem can also be included in order to exemplify the above technique. Therefore, the fact that those non-essential structural elements are described in the accompanying drawings and detailed description should not immediately determine that those non-essential structural elements are essential.

In addition, since the above described embodiments are for illustrating the examples of the technique in the present disclosure, various changes, replacements, additions, omissions, etc. can be made within the scope of claims or the equivalent scope thereof.

INDUSTRIAL APPLICABILITY

The present disclosure is applicable to, for example, an image display device switchable between an image display mode and a transmissive mode.

The invention claimed is:

1. An image display device comprising:
a display panel body which displays an image on a front surface of the display panel body;
a drive board which is disposed along one side of the display panel body to drive the display panel body;
a flexible board which electrically connects the display panel body and the drive board;
a light control panel body which faces a back surface of the display panel body, the light control panel body being switchable between a transmissive state and a non-transmissive state, the transmissive state being a state where light is transmissive through the light control panel body, the non-transmissive state being a state where less light is transmissive through the light control panel body than the transmissive state; and
an electrode portion which includes an electrode body and an electrode tab, the electrode body being disposed in an outer peripheral portion of the light control panel body along the one side of the display panel body, the electrode tab extending from the electrode body crossing the one side of the display panel body while avoiding an overlap with the drive board in a front view of the display panel body;
a controller which switches between an image display mode and a transmissive mode, the image display mode being a mode in which an image is displayed on the display panel body and the light control panel body is in the non-transmissive state, the transmissive mode being a mode in which an image is not displayed on the display panel body and the light control panel body is in the transmissive state; and
a lead wire which electrically connects the electrode tab and the controller.

2. The image display device according to claim 1, wherein the electrode portion includes a first electrode portion and a second electrode portion,
an electrode body of the first electrode portion and an electrode body of the second electrode portion are elongated along the one side of the display panel body, and
an electrode tab of the first electrode portion extends from one lengthwise end portion of the electrode body of the first electrode portion crossing the one side of the display panel body while avoiding an overlap with the drive board, and an electrode tab of the second electrode portion extends from one lengthwise end portion of the electrode body of the second electrode portion crossing the one side of the display panel body while avoiding an overlap with the drive board, the electrode tab of the first electrode portion and the electrode tab of the second electrode portion being disposed on one side of the drive board.

3. The image display device according to claim 1, wherein the electrode portion includes a first electrode portion and a second electrode portion, an electrode body of the first electrode portion and an electrode body of the second electrode portion are elongated along the one side of the display panel body, and are spaced apart from each other, and an electrode tab of the first electrode portion extends from one lengthwise end portion of the electrode body of the first electrode portion crossing the one side of the display panel body while avoiding an overlap with the drive board, and an electrode tab of the second electrode portion extends from one lengthwise end portion of the electrode body of the second electrode portion crossing the one side of the display panel body while avoiding an overlap with the drive board, the electrode tab of the first electrode portion and the electrode tab of the second electrode portion being disposed on opposite sides of the drive board.

4. The image display device according to claim 1, wherein the drive board includes a first drive board and a second drive board spaced apart from each other along the one side of the display panel body, the flexible board includes: a first flexible board which electrically connects the display panel body and the first drive board; and a second flexible board which electrically connects the display panel body and the second drive board;

the electrode portion includes a first electrode portion and a second electrode portion, an electrode body of the first electrode portion and an electrode body of the second electrode portion are elongated along the one side of the display panel body, and are spaced apart from each other, and an electrode tab of the first electrode portion extends from one lengthwise end portion of the electrode body of the first electrode portion toward a portion between the first drive board and the second drive board, and an electrode tab of the second electrode portion extends from one lengthwise end portion of the electrode body of the second electrode portion toward a portion between the first drive board and the second drive board.

5. The image display device according to claim 2, further comprising:

a tubular metal sleeve which is crimped while covering one end portion of the lead wire, and is wound around the electrode tab of the first electrode portion along a lengthwise direction of the electrode body of the first electrode portion and the electrode tab of the second electrode portion along a lengthwise direction of the electrode body of the second electrode portion.

* * * * *